United States Patent
Arioka et al.

(10) Patent No.: US 6,808,778 B2
(45) Date of Patent: Oct. 26, 2004

(54) OPTICAL RECORDING MEDIUM (75) Inventors: Hiroyuki Arioka, Tokyo (JP); Hideki Sunohara, Tokyo (JP)

(73) Assignee: TDK Corporation, Tokyo (JP)

(*) Notice: Subject to any disclaimer, the term of this patent is extended or adjusted under 35 U.S.C. 154(b) by 228 days.

(21) Appl. No.: 09/897,428

(22) Filed: Jul. 3, 2001

(65) Prior Publication Data
US 2002/0034604 A1 Mar. 21, 2002

(30) Foreign Application Priority Data

| Jul. 4, 2000 | (JP) | ................................ 2000-202149 |
| Jul. 4, 2000 | (JP) | ................................ 2000-202150 |

(51) Int. Cl.[7] .............................................. B32B 3/02

(52) U.S. Cl. ............... 428/64.1; 428/64.4; 430/270.14; 369/121

(58) Field of Search ............................. 428/64.1, 64.4, 428/64.8, 457, 913; 430/270.14, 495.1, 945; 369/283, 288, 116, 121, 124.04

(56) References Cited

U.S. PATENT DOCUMENTS

| 5,213,955 A | * | 5/1993 | Hamada et al. ............. 430/276 |
| 2002/0015371 A1 | * | 2/2002 | Arioka .................... 369/59.11 |
| 2002/0192423 A1 | * | 12/2002 | Arioka ...................... 428/64.4 |
| 2003/0039191 A1 | * | 2/2003 | Arioka .................... 369/59.11 |

* cited by examiner

Primary Examiner—Elizabeth Mulvaney (57) ABSTRACT

An optical recording medium is provided with a recording layer and a reflecting film on an optically transparent substrate. The principal component of the recording layer is a dye. Virtual recording cells are assumed within grooves on the recording layer and recording marks with five different levels or more of increasing size are formed on each of the virtual recording cells by modulating the irradiation time of the laser beam in five levels or more in correspondence to the information to be recorded. The reflectance of the virtual recording cells modulates in many levels and the reflection level of the reading laser beam during regeneration is changed in five levels or more. The optically transparent substrate is made of a plastic with a glass transition point (Tg) of 160° C. or less. The reflecting film is a metal with a coefficient of thermal conductivity of 300 k/W·m$^{-1}$·K$^{-1}$ or more and a film thickness of 50 nm or more.

8 Claims, 4 Drawing Sheets

OPTICAL RECORDING MEDIUM

BACKGROUND OF THE INVENTION

1. Field of the invention

The present invention relates to an optical recording medium that switches either the irradiation time or the irradiation power of a laser beam in many levels in correspondence to data used in the recording, irradiates the recording layer with the laser beam and then records the data in multiple levels.

2. Related Art

A great deal of research has been carried out related to methods to record multiple pieces of data in signals with identical length by switching the depth of a regeneration signal (modulation factor of reflection signal) in many levels in contrast to methods to record data by changing the length of a regeneration signal (length of the modulated part of the reflection signal) in many levels with conventional optical recording mediums such as CD-R or DVD-R which are provided with recording layers and reflecting films, in this order, on an optically transparent substrate.

According to this optical recording method, because it is possible to record multiple pieces of data in the direction of depth compared to when binary data is recorded depending on the presence or absence of only a pit, the amount of signals assigned to fixed lengths can be increased. Consequently, optical recording methods which use holographs or optical recording mediums with multiple recording layers have been proposed in order to improve the linear recording density.

Hereupon, a case wherein data is recorded in many levels using a depth variation of the reflectance is called multilevel recording.

In this type of multilevel recording the recording marks must be shortened in order to improve the recording density.

Multilevel recording is, however, difficult when attempting to reduce the recording marks smaller than the beam diameter of a converged laser used for recording and reading.

For example, Japanese Patent Laid-Open Publication No. Hei. 10-134353 describes a method in which the quantity of laser light is adjusted in order to record multiple levels. In this method a regeneration signal is formed by differences in the reflection of the recording part and the non-recording part when the recording medium is a dye film or a phase-changing film. Consequently, in the method in Japanese Patent Laid-Open Publication No. Hei. 10-134353, the non-recording level and the recording level depend on a relationship of whether or not a recording exists and are not suitable for recording in many levels. Stated more clearly, nothing exists in the intermediate state between recording and non-recording for a phase-changing film or a dye film.

Up to the present the reason why multilevel recording in many levels was possible by means of modulating the quantity of laser light using a dye film or a phase-changing film as the recording medium was mainly due to the fact that the widths of the recording marks were changed by changing the power of the laser.

A converging beam normally forms a Gaussian distribution although when the recording film is a dye film or a phase-changing film, the recording is performed on the portion that exceeds a certain threshold value. Changing the power of the laser changed the spot size of the converging beam that can record which in turn changed the width of the recording marks.

If, however, the length of the recording marks are shortened to increase the recording density, it becomes difficult to perform multilevel recording in many levels, in particular in five levels or more, using a method that modulates the power of the laser to change the recording mark width. In other words, changing the recording power makes it difficult to change the reflection level during a regeneration in five levels or more, Normally, the diameter of the converging beam is expressed by $K\lambda/NA$ (K; constant, $\lambda$: laser wavelength, NA: numerical aperture). Normal values for a pickup used in a CD are $\lambda=780$ nm, NA=0.45 with a diameter of approximately 1.6 $\mu$m. For this case, if the recording mark length was 1.6 $\mu$m or less, it is difficult to perform multilevel recording in five levels or more using a conventional method that changes the laser power.

Further, there is an example of an optical recording medium as disclosed in Japanese Patent Laid-Open Publication No. Hei. 1-182846 wherein the absorbance of the reactive material in the recording layer changes as a digital value when a quantity of incident light is supplied as a digital value.

The absolute value of the absorbance change is presumed to be very small for this optical recording medium however and has not yet attained practical use.

Furthermore, an optical recording method is disclosed in Japanese Patent Laid-open Publication No. Sho. 61-211835 in which the intensity or irradiation frequency of the irradiation light irradiating a photochromic material is changed in order to record at different arbitrary coloring density states.

In this optical recording method there is a problem in which the coloring density state cannot be read in live levels of more when irradiating and scanning laser light.

The rapid occurrence of thermal decomposition of dyes in optical recording mediums used as a recording materials which use dye as the principal material was considered to be favorable in conventional recording methods. This is because the signal quality is better due to the clear boundary between the recording part and the non-recording part.

If, however, there is rapid decomposition of the dye material during multilevel recording, decomposition of the dye will suddenly begin when a specified laser irradiation time or irradiation power is exceeded making it difficult to control the recording in many levels required for multilevel recording.

SUMMARY OF THE INVENTION

The inventor has discovered that it is possible to perform multilevel recording in five levels or more by means of changing 7:4 the irradiation time or the irradiation power of the laser when the recording mark length is shorter than the diameter of the converging beam. The inventor has also discovered that a dye material that changes gradually is more suitable as a material for a recording film than a phase-changing material that changes quickly from non-recording to recording following temperature increases in the laser irradiation.

Furthermore, the inventor has found out it is possible to favorably perform multilevel recording by stipulating the thermal decomposition characteristics of the dye material.

At this point the thermal energy absorbed by the recording film will grow larger in line with lengthening of the laser irradiation time and/or increases in the laser irradiation power. If the thermal energy exceeds a certain threshold value, the dye will decompose and deteriorate and recording will be performed on the recording film. Excessive thermal energy that exceeds the threshold value passes through the reflecting film and diffuses around the edge. For example, if the diffusion of the thermal energy is insufficient for an optical recording medium such as a CD-R, unfavorable effects will occur such as deformation of the substrate or the guide tracks cut into the substrate.

Taking the above-mentioned issues into consideration, an object of the present invention is to provide an optical recording medium that utilizes a widely used optical recording medium, such as CD-R, to perform multilevel recording in many levels and can obtain favorable signal quality. In particular, to provide an optical recording medium that prevents deformation of the optically transparent substrate or the channels cut into the substrate used to guide the laser as well as prevent degradations in the recording signals due to deformation of the protective film on the reflecting film by making the diffusion of the thermal energy by the laser irradiation sufficient and/or by controlling the thermal decomposition characteristics of the dye material. In addition, an object of the present invention is to provide an optical recording medium that can favorably perform multilevel recording control.

The inventor has diligently conducted research on an optical recording medium and discovered a recording method that performs multilevel recording on this optical recording medium, and also verified that this recording method can perform high-density multilevel recording in five levels or more on this optical recording medium. Furthermore, the inventor has performed various types of experiments and found that stipulating the material properties of the optically transparent substrate and the coefficient of thermal conductivity and film thickness of the reflecting film was important for thermal diffusion. In addition, the inventor has found that if a dye whose thermal decomposition exceeds a range extending over 100° C. or more is used, favorable recording becomes possible extending over the time when the laser irradiation time goes from short to long and/or extending over the time when the laser irradiation power goes from low to high. Even further, the inventor has found that if a dye whose thermal decomposition starts at 300° C. or less is used, high sensitive recording becomes possible through which the inventor has completed the present invention.

In other words, the above-mentioned objectives are achievable by means of the present invention as follows.

(1) An optical recording medium, having a recording layer, whose principal component is a dye, provided on an optically transparent substrate, and a reflecting film formed on the recording layer, the medium being able to record information by irradiating a laser beam to form recording marks on said recording layer and read the recorded information by irradiating a reading laser beam onto the recording mark; wherein said recording layer has a virtual recording cell specified in an arbitrary unit length in a direction of relative movement between the laser beam and the recording layer and in a unit width in a direction that intersects said direction of movement at a right angle and continuously set in said direction of movement; said recording layer at said virtual recording cell can form recording marks with different sizes in correspondence to either a modulation of an irradiation time of the laser beam or an irradiation power in five levels or more; this allows multilevel recording of five levels or more of information by means of modulating the reflectance based on the area ratio of said recording marks to said virtual recording cells and transmittance, at least the area ratio; said optically transparent substrate is made of a thermoplastic resin with a glass transition point (Tg) of between 80° C. and 160° C.; said reflecting film is a metal with a coefficient of thermal conductivity of 300 k/W·m$^{-1}$·K$^{-1}$ or more and a film thickness at the recording mark of 50 nm or more.

(2) The optical recording medium according to (1), wherein said reflecting film material is characterized by the product of the coefficient of thermal conductivity and the film thickness being $2\times10^{-5}$ k/W·K$^{-1}$ or more.

(3) An optical recording medium, having a recording layer, whose principal component is a dye, provided on an optically transparent substrate, the medium being able to record information by irradiating a laser beam to form recording marks on said recording layer and read the recorded information by irradiating a reading laser beam onto the recording mark; wherein said recording layer has a virtual recording cell specified in an arbitrary unit length in a direction of relative movement between the laser beam and the recording layer and in a unit width in a direction that intersects said direction of movement at a right angle and continuously set in said direction of movement; aid recording layer at said virtual recording cell can form recording marks with different sizes in correspondence to either a modulation of an irradiation time of the laser beam or an irradiation power in five levels or more; this allows multilevel recording of five levels or more of information by means of modulating the reflectance based on the area ratio of said recording marks to said virtual recording cells and transmittance, at least the area ratio; the dye used in said recording layer is made in such a manner that differences in a weight reduction start temperature due to thermal decomposition (TG) and a temperature when a weight thereof becomes 20% of an original weight thereof extends over a range of 100° C. or more.

Using a material with a coefficient of thermal conductivity of 300 k/W·m$^{-1}$·K$^{-1}$ as the reflecting film material in the present invention or setting the thickness of the reflecting film to 50 nm or less results in excessive heat causing deformation of the substrate or the channels cut into the substrate used to guide the laser as well as deformation of the protective film on the reflecting film leading to degradations in the recording signals.

This effect is dependent on the glass transition temperature of the substrate material on which laser guide grooves are provided. When a material with a high glass transition temperature, such as glass, is used as the material, deformation due to heat is not apparent. If a material with a glass transition temperature between 80° C. and 160° C. is used, this effect was found to be quite evident.

This thermal diffusion effect was also verified to be especially large during multilevel recording with adjacent recording marks in the recording direction.

These effects were present due to heat that occurred while recording in optical recording mediums used up to the present. However, it is assumed that even greater effects would more easily occur due to recording marks being placed adjacent in a linear direction in order to improve the recording density in the multilevel recording method.

Further, the size of the recording marks stated here refers to the size of changes in the quantity when the material constituting the recording layer decomposes and deteriorates due to irradiation of the laser beam to change the refractive index thereof or when the transmittance is changed due to the size in the direction of thickness when the refractive index changes.

In the present invention the reflectance could be controlled in many levels by means of specifying a dye constituting the recording layer.

Further, the optical recording medium may be constructed as follows.

(4) The optical recording medium according to (3), wherein said dye is characterized by weight reduction due to said thermal decomposition starting at 300° C. or less and continuing until 350° C. or more.

(5) the optical recording medium according to (3), wherein a reflecting film is provided on said recording layer on a side opposite to a side on which the laser beam is incident, said optically transparent substrate is made of a thermoplastic resin with a glass transition point (Tg) of between 80° C. and 160° C., and said reflecting film is a metal with a coefficient of thermal conductivity of 300 k/W·m$^{-1}$·K$^{-1}$ or more and a film thickness on a recording mark of 50 nm or more.

(6) The optical recording medium according to (5), wherein said reflecting film material is characterized by the product of the coefficient of thermal conductivity and the film thickness being ×10$^{-5}$ k/W·K$^{-1}$ or more.

(7) The optical recording medium according to (4), wherein a reflecting film is provided on said recording layer on a side opposite to a side on which the laser beam is incident, said optically transparent substrate is made of a thermoplastic resin with a glass transition point (Tg) of between 80° C. and 160° C., and said reflecting film is a metal with a coefficient of thermal conductivity of 300 k/W·m$^{-1}$·K$^{-1}$ or more and a film thickness on a recording mark of 50 nm or more.

(8) The optical recording medium according to (7), wherein said reflecting film material is characterized by the product of the coefficient of thermal conductivity and the film thickness being 2×10$^{-5}$ k/W·K$^{-1}$ or more.

(9) The optical recording medium according to any one of (1)–(8), wherein the unit length of said virtual recording cell is set almost equal to the length of the recording mark formed by laser beam irradiation for the maximum amount of time.

(10) The optical recording medium according to any one of (1)–(9), wherein: grooves for guising laser beam are provided along said recording layer, said virtual recording cells are set inside said grooves and said unit width matches a width of said groove.

(11) The optical recording medium according to any one of (1)–(10), wherein said unit length in said virtual recording cells are equal to or less than the diameter of beam waist of said reading laser beam.

(12) The optical recording medium according to any one of (1)–(11), wherein information is recorded in multiple levels in advance on one part of said recording layer.

(13) The optical recording medium according to any one of (1)–(12), wherein specific information which represents a multilevel recording medium is recorded on at least one of said virtual recording cells and a multilevel recorded part.

(14) The optical recording medium according to any one of (1)–(13), wherein grooves for guiding laser beam are provided along said recording layer and are cut in the middle.

PREFERRED EMBODIMENTS OF THE INVENTION

Embodiments of the present invention will be now described in detail with reference to the drawings.

An optical recording medium 10 according to the embodiment of the present invention is a CD-R that uses a dye on a recording layer 12 and is composed of an optically transparent substrate 14 including a transparent substrate material, the recording layer 12 composed of a dye coated on and covering the grooves 16 used to guide the laser beam formed on one surface of the optically transparent substrate 14 (upper surface in FIG. 1), a reflecting film 18 whose principal component is gold or silver or an alloy comprising these formed by sputtering or vacuum deposition on the upper side of the recording layer 12, and a protective layer 20 that covers the outside of the reflecting film 18. Irregularities (pre-grooves or pits) which represent information such as the grooves 16 or address signals are formed on the optically transparent substrate 14.

Figure 1:
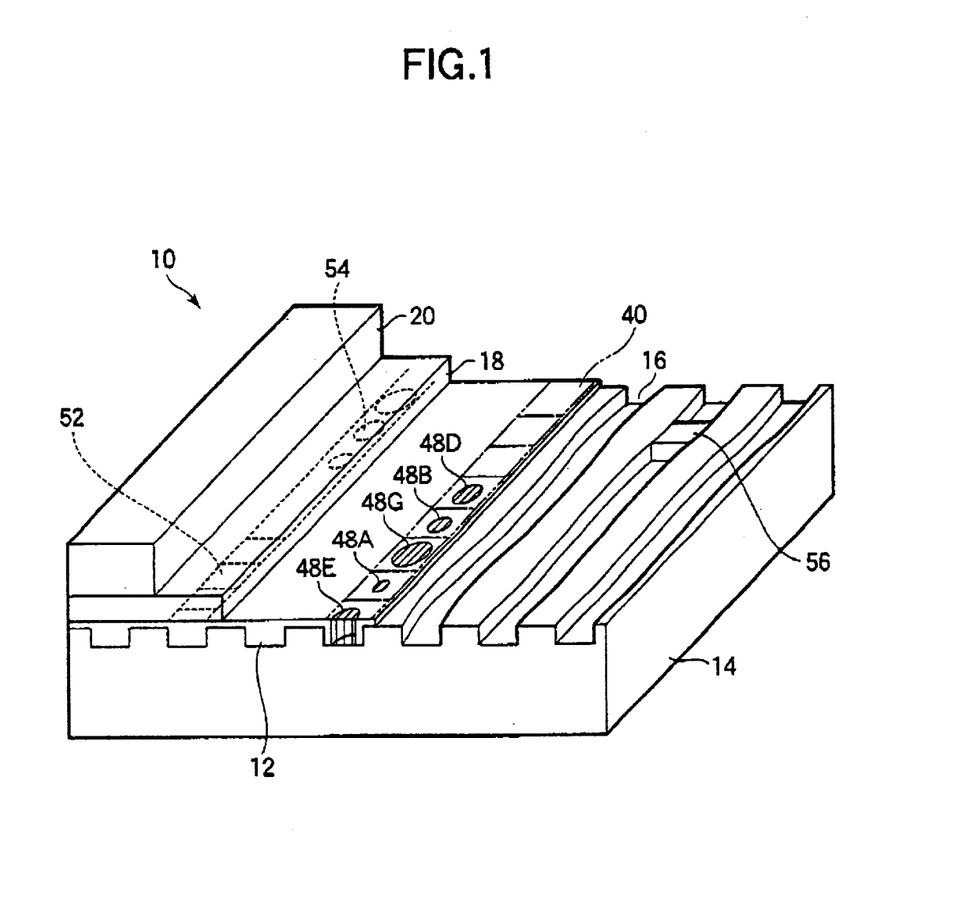
FIG. 1 is a partial cross-sectional perspective view showing principle parts of an optical recording medium according to an embodiment of the present invention.

The optically transparent substrate 14 is a thermoplastic resin with a glass transition point (Tg) of between 80° C. and 160° C. and can be freely selected from among various types of materials being used in conventional optical recording mediums. For example, resins which can be used include a polycarbonate resin, polymethylmethacrylate resin, epoxy resin, polyolefin resin, and polyester resin. Further, the glass transition point is regulated by, for example, differential thermal analysis set forth in JIS K7121.

The principal component of the recording layer 12 on the optically transparent substrate 14 is an organic dye. The dyes which can be used for this organic dye include cyanine dye, squarylium dye, croconium dye, anthraquinone dye, metal containing azo dye, phthalocyanine dye and naphthoquinone dye. From among these various dyes a dye having a difference between the weight reduction start temperature due to thermal decomposition (TG) in an inert gas atmosphere and the temperature when the weight becomes 20% of the original weight extending over a range of 100° C. or more can be used. In addition, weight reduction due to thermal decomposition of the dye starts at 300° C. or less and continues until 350° C. or more.

The decomposition temperature of the dye can be controlled by introducing various types of polar groups including alkyl group, alkoxide group, allyl group, halogen atoms, alkylcarbonyl group, alkyl sulfonyl group, alkyl sulfonamide group, cyano group and nitro group or by changing the counter-ion composition in the ionic dyes.

The following materials can be used as a solvent for the organic dye coating solution: esters such as butyl acetate and cellosolve acetate; ketones such as methyl ethyl ketone, cyclohexanone and methyl isobutyl ketone; chorinated hydrocarbons such as dichloromethane, 1,2-dichloro ethane and chloroform; amides such as dimethylform amide; hydrocarbons such as cyclohexane; ethers such as tetrahydorfuran, ethyl ether and dioxane; alcohols such as ethanol, n-propanol, isopropanol, n-butanol and diacetone alcohol; fluorine solvents such as 2,2,3,4-tetrafluoro propanol; and glycol ethers such as ethyleneglycol monomethyl ether, ethyleneglycol monoethyl ether and propyleneglycol monomethyl ether. These solvents can be used independently or in combination taking into consideration solubility of the organic dyes being used. Various types of additives such as singlet oxygen quenchers, antioxidants, UV absorbents, plasticizers or lubricants may be further added to the coating solution depending on the purpose.

The reflecting film 18 on the recording layer 12 is a metal with a coefficient of thermal conductivity of 300 k/W·m$^{-1}$·K$^{-1}$ or more at a normal temperature (approximately 20° C.). This metal is gold, silver or copper, or an alloy thereof. The reflecting film 18 is formed by a sputtering method or a vacuum deposition method the thickness of the reflecting film 18 is 50 nm or more at the area where a recording mark (described later) is formed and is preferably 60~300 nm thick. Further, the product of the coefficient of thermal conductivity and the film thickness of the material used for the reflecting film 18 is set to be $2 \times 10^{-5}$ k/W·K$^{-1}$ or more.

The protective layer 20 is provided on the reflecting film 18 for the purpose of physically and chemically protecting the organic dye recording layer 12 and the reflecting film 18. The protective layer can also be provided to improve the anti-scratch properties and excess moisture tolerance on the side of the optically transparent substrate 14 where the organic dye recording layer 12 is not provided.

Generally, UV curable resins are widely used for the protective layer 20 material. After preparing a coating solution of this UV curable resin as is or by dissolving in a suitable solvent, the protective layer 20 is formed by coating the coating solution onto the optically transparent substrate 14 and then irradiating ultraviolet light to harden the solution. Depending on the objective, various different additives such as an antistatic additive, an antioxidant and an ultraviolet absorbent can be added to this coating solution. The layer thickness of the protective layer 20 is approximately 0.1~100 μm.

Figure 2:
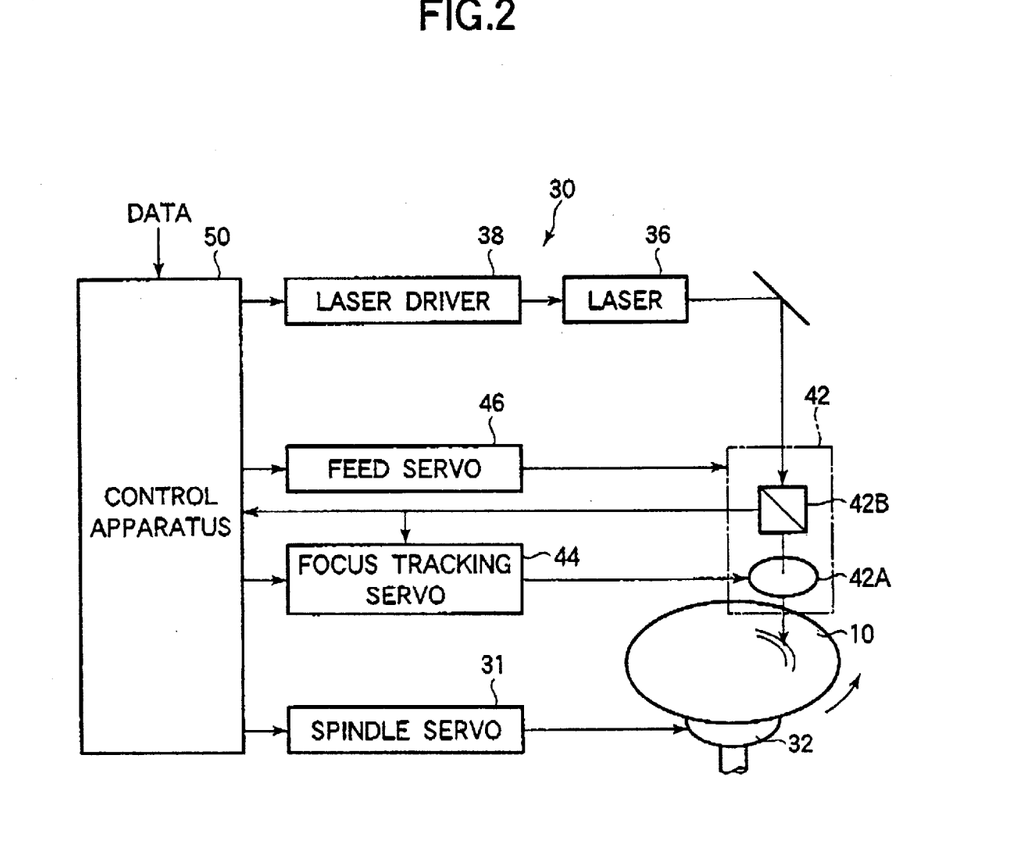
FIG. 2 is a block diagram showing an optical recording device that uses a laser beam to record information on the optical recording medium.

Multilevel recording onto the optical recording medium 10 obtained in this manner is performed by means of the optical recording apparatus 30 shown in FIG. 2.

The recording onto the optical recording medium 10 is performed using, for example, a semiconductor laser beam as the recording light that has a wavelength in a range of 770~790 nm or a wavelength in a range of 630~660 nm to deteriorate an organic dye by irradiating a suitable laser beam onto the organic dye recording layer 12 while rotating the optical recording medium 10 at a fixed linear velocity or at a fixed-angle velocity. Data regeneration is performed by reading differences in the amount of reflected laser light at areas when the organic dye deteriorated and areas where it did not.

The optical recording apparatus 30 is a CD-R recorder. This recorder records information by means of a laser beam from a laser 36 while rotating the optical recording medium (disk) 10 by a spindle motor 32 at a fixed linear velocity or at a fixed-angle velocity via a spindle servo 31 onto the recording layer 12 formed as described above on the optical recording medium (disk) 10.

Figure 3:
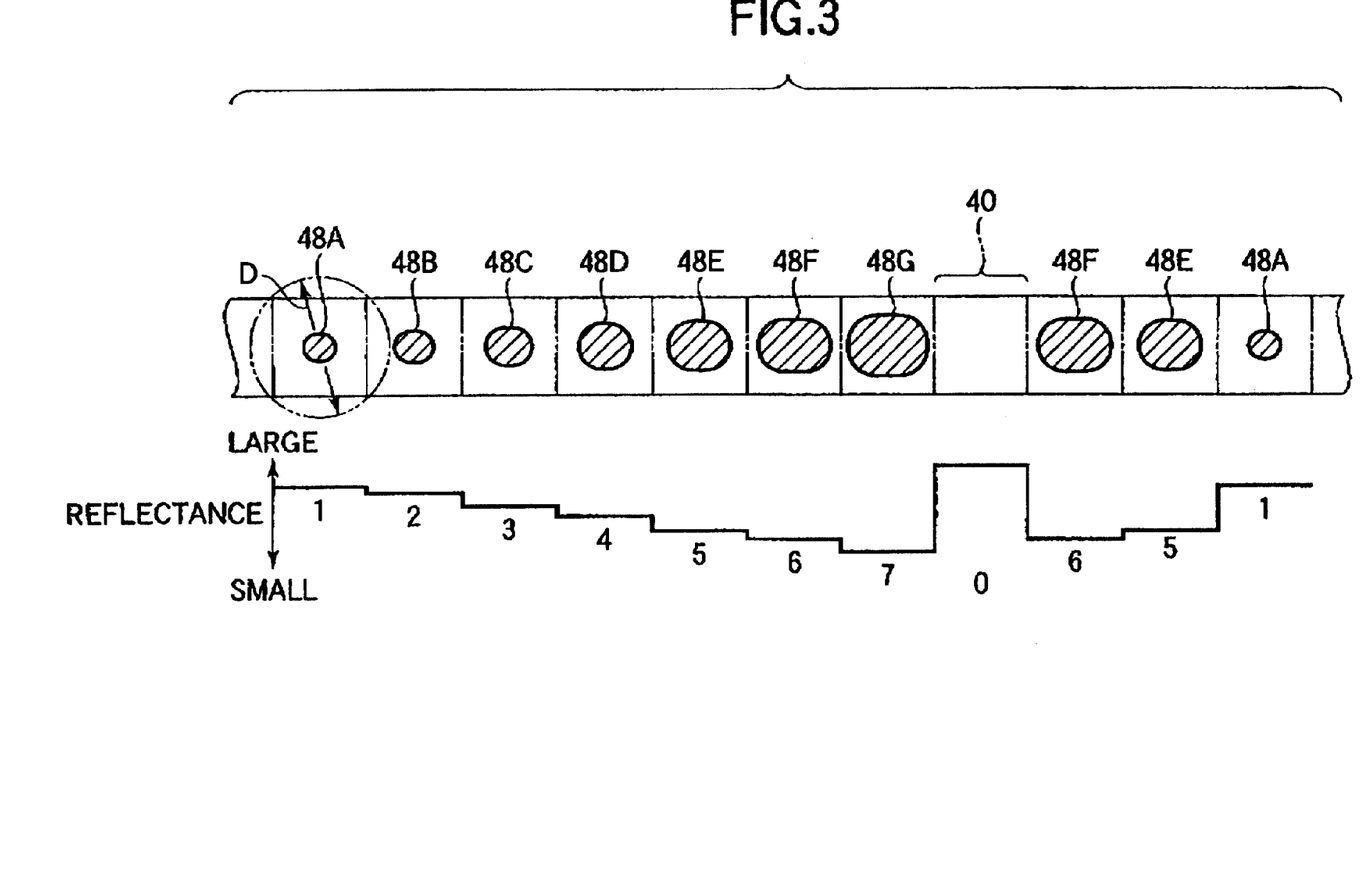
FIG. 3 is a model view showing the relationship between a recording mark, a virtual recording cell and the optical reflectance thereof when forming the recording mark on a recording layer by means of the optical recording device.

The laser 36 is designed to use the laser driver 38 to control the laser beam irradiation time, namely, the number of laser pulses, for each of the virtual recording cells 40 (described later) shown in FIG. 1 and FIG. 3 depending on the information to be recorded.

Reference numeral 42 in FIG. 2 designates a recording optical system that includes an objective lens 42A and a half mirror 42B. Focus tracking control is performed by a focus tracking servo 44 in order that the objective lens 42A converges the laser beam on the recording layer 12. Further, the objective lens 42A and the half mirror 42B are controlled and moved by a feed servo 46 at a fixed speed from the outer periphery to the inner periphery in phase with the rotation of the disk. The spindle servo 31, laser driver 38, focus tracking servo 44 and feed servo 46 are controlled by a control apparatus 50. Data (information) to be recorded onto the recording layer 12 is entered into the control apparatus 50.

Next, the virtual recording cell 40 and the recording marks recorded on the virtual recording cell 40 will be described.

These virtual recording cells are specified in unit widths in the radial direction and unit lengths in the rotational direction of a recording medium. A unit width is a width equal to or less than the diameter of the beam waist of the laser beam and can be freely selected from among the track pitch or groove width of the disk 10.

As shown in FIG. 1, the virtual recording cells 40 of this embodiment are assumed to be continuous circumferentially inside the groove 16 and have a length (circumferential length) shorter than the beam diameter D (diameter of beam waist) in the rotational direction, circumferentially, of the disk 10. In addition, the width is set equal to the groove 16. The laser beam is irradiated onto each virtual recording cell 40 forming the recording marks 48A~48G in response to the information to be recorded as shown in typical fashion in FIG. 3.

Here, the beam diameter D of the laser beam emitted from the laser 36 at the position of the recording layer 12 grows larger than the virtual recording cell 40. Depending on the material selected for the recording layer 12, however, the recording marks 48A~48G can be formed with different diameters at the center of the laser beam in response to the laser irradiation time (The laser beam is circular although, since the beam irradiates while the optical recording medium is rotating, the recording marks form long circular shapes in response to the irradiation time.).

Because the focused laser beam normally forms a Gaussian distribution, recording is only performed at the portion where the threshold value of the irradiation energy of the laser beam is exceeded on the recording layer 12. Because of this, the spot size of the laser beam that can record on the recording medium changes due to changes in the irradiation time of the laser beam. This, for example, can form seven levels of recording marks 48A~48G as shown in FIG. 3.

Here, the dye constituting the recording layer 12 is specified as described above. Since decomposition and deterioration do not rapidly occur relative to the irradiation time of the laser beam, favorable multilevel recording is possible.

The size of each of the recording marks 48A~48G is set such that the reflectance of the reflecting light when the reading laser beam irradiates the virtual recording cells 40 becomes seven levels. The reflectance grows larger as the recording marks grow smaller. The maximum reflectance is present at virtual recording cells where recording marks are not formed and the minimum reflectance is present at virtual recording cells where the largest recording mark 48G is formed.

In more detail, the reflectance is set taking into consideration the area ratio for each of the recording marks 48A~48G relative to the virtual recording cells 40 and the transmittance of the recording marks themselves.

The transmittance of the recording marks 48A~48G themselves differs because the material constituting the recording layer 12 decomposes and deteriorates due to irradiation of the laser beam to change the refractive index or because the quantity of the recording layer 12 in the thickness direction changes. If the transmittance of the recording mark portion that was formed is zero, there is no need for this consideration.

At this time, a material with a coefficient of thermal conductivity of 300 k/W·m$^{-1}$·K$^{-1}$ or more is used as the material for the reflecting film 18. The thickness of the reflecting film 18 is 50 nm or more. Further, a material with a glass transition point (Tg) of between 80° C. and 160° C. is used for the optically transparent substrate 14. Consequently, there is no excessive heat due to the laser beam irradiation causing deformation of the optically transparent substrate 14, the grooves 16 used to guide the laser cut into the optically transparent substrate 14 or the protective layer 20 on the reflecting film 18. Thus, there is no degradation in the recording signals.

In the embodiment described above, although the irradiation time of the laser beam is changed in five levels or more to perform multilevel recording on the recording layer 12, the present invention is not limited to this. The irradiation power of the laser beam or the irradiation time and irradiation power can be changed.

Although in this embodiment the optical recording medium 10 is a CD-R disk as described above, the present invention is not limited to this and normally can be applied to another optical recording medium.

The example in the embodiment described above is an example of the optical recording medium 10 whereon information such as data is not recorded although the present invention is not limited to this. The present invention can also be applied to an optical recording medium onto which multilevels of information has been recorded in five levels or more.

Even further, the size of the virtual recording cells 40 set in the recording layer 12 when forming recording marks by means of the optical recording apparatus 30 is not limited to the example in this embodiment but can be any length equal to or less than the diameter of the beam waist of the laser beam. In addition, although the size of the virtual recording cells 40 can be freely set for an optical recording medium not provided with the grooves 16, it is preferable to set the virtual recording cells 40 to a length almost equal to the recording marks formed when the irradiation energy at the point where laser beam is at its longest irradiation time exceeds the threshold value that provides changes to the recording layer 12.

Figure 4:
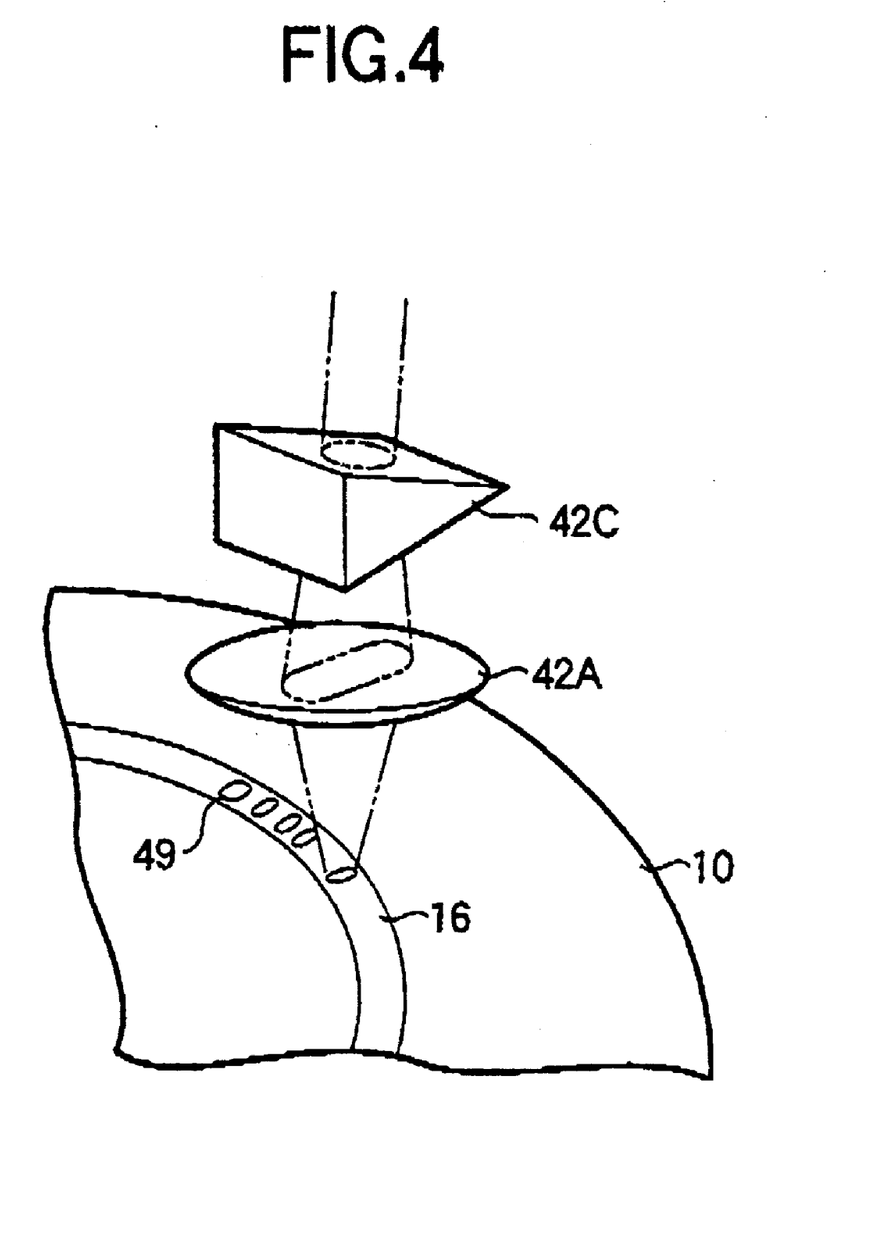
FIG. 4 is a partial perspective view showing a case when a laser beam that irradiates a virtual recording cell forms another shape.

The laser beam mentioned above forms a circular shape at the position of the recording layer 12. As shown in FIG. 4 however, this can utilize, for example, a beam shaping prism 42C in addition to the objective lens 42A and the beam shape can be short in the feed direction of the recording medium 10 and a long ellipse or a linear shape at a right angle to this, For this case, because the recording marks 49 become shorter, the virtual recording cells can also be made shorter. In other words, the recording density can be improved.

As designated by reference numeral 52 in FIG. 1, by means of either having in advance a plurality of pits with a number of different reflectances matching the number of levels of the signal modulation or by performing multilevel recording as described above in advance on a portion of the optical recording medium, the recording medium 10 has information that separately identifies the recording medium at the recording marks 54 of these plurality of pits 52 and/or the portions where multilevel recording is complete, information that identifies an optical recording medium for use with multilevel recording, and specific information such as information that determines the laser beam power needed to record/regenerate the recording medium. This specific information can reliably identify an optical recording medium for use with multilevel recording by means of regeneration of the optical recording medium and/or reading data for recording as well as separately identify these and determine the number of levels of the laser beam power in response to the number of pits already recorded. Because of this, even more reliable multilevel recording and regeneration is possible. In addition to this, as designated by reference numeral 56 in FIG. 1, the same effect can be achieved by means of providing a groove interruption part that cuts the groove of laser beam guides in the middle. These methods can be used independently or combined.

EXAMPLE

In the following examples 1~9 of the present invention will be described in comparison to comparative examples 1~6. Here a CD-R that used a dye on the recording layer 12 was utilized as the optical recording medium 10 to carry out experiments on multilevel recording.

Example 1

Cyanine dye was dissolved into a fluoridated alcohol to prepare a 2% coating solution used to form a recording layer. A spin coat method in which the rpm was varied from 200 rpm up to 5000 rpm was used to coat this coating solution onto the surface of a pre-groove side of an optically transparent substrate with a diameter of 120 mm and a thickness of 1.2 mm that was composed of a polycarbonate resin (Teijin Kasei Inc.; Panlight AD5503) whereon a spiral-shaped pre-groove (track pitch: 1.6 μm, pre-groove width 0.35 μm, pre-groove depth 0.18 μm) was formed by means of injection molding. This process formed an organic dye recording layer approximately 200 nm thick from the bottom of the inside of the pre-groove. The glass transition temperature of the polycarbonate was 140° C.

Next, a sputtering method was utilized to form an Ag (coefficient of thermal conductivity of silver is 427 k/W m$^{-1}$·K$^{-1}$; chronological table of science) reflecting film approximately 50 nm thick on the organic dye recording layer. In addition, a spin coat method in which the rpm was varied from 300 rpm up to 4000 rpm was used to coat a UV curable resin (Dainippon Ink Kagaku Kogyo Inc.: SD318) onto this reflecting film. After the coating was completed, ultraviolet rays were irradiated by a mercury vapor lamp from above the coating film to form a 10 μm thick protective layer.

Multilevel recording was then attempted using the optical recording medium obtained in this manner Multilevel recording was performed by means of changing the time the laser beam irradiates the optical recording medium in six levels while rotating the optical recording medium at a fixed linear velocity Regeneration was performed by means of irradiating a 1 mW laser beam while rotating the optical recording medium at the same fixed linear velocity and then detecting differences in the reflected amount of light. The device used to evaluate the recording was a DDU (laser wavelength=784 nm) manufactured by Pulstec Industrial Co., Ltd. and the laser beam power while recording was 14 mW. The recording linear velocity was 4.8 nm/sec and the clock frequency of the recording was 4 MHz (250 nsec).

The laser irradiation times while recording onto the optical recording medium were (1) 50 nsec, (2) 80 nsec, (3)

110 nsec, (4) 140 nsec, (5) 170 nsec, and (6) 200 nsec to perform multilevels recording. Each signal was recorded over a period of one revolution of the disk.

When recording was performed in this manner and the jitter values of the recorded signals were read in and measured using a digital oscilloscope LC-534EL manufactured by Le Croy Corp., fluctuations due to differences in the laser beam irradiation time while recording were small and favorable results were obtained.

Taking into consideration a case in which the recording is performed using a conventional binary recording and regeneration method in the measurement apparatus for jitter values being used here, it is possible to judge whether favorable recording is performed if the jitter value is 10% or less.

Example 2

An optical recording medium was produced in the same manner as example 1 and multilevel recording performed although the film thickness of the Ag reflecting film was changed to 100 nm. The recording conditions were identical to example 1. Jitter values of the recorded signals were measured in the same manner.

Example 3

An optical recording medium was produced in the same manner as example 1 and multilevel recording performed although the reflecting film material was changed to Au (coefficient of thermal conductivity of gold is 318 k/W·m$^{-1}$·K$^{-1}$; chronological table of science) The recording conditions were identical to example 1. Jitter values of the recorded signals were measured in the same manner.

Example 4

An optical recording medium was produced in the same manner as example 3 and multilevel recording performed although the film thickness of the reflecting film was changed to 100 nm. The recording conditions were identical to example 1. Jitter values of the recorded signals were measured in the same manner.

Example 5

An optical recording medium was produced in the same manner as example 1 and multilevel recording performed although the reflecting film material was changed to Cu (coefficient of thermal conductivity of copper is 401 k/W·m$^{-1}$·K$^{-1}$; chronological table of science). The recording conditions were identical to example 1. Jitter values of the recorded signals were measured in the same manner.

Example 6

An optical recording medium was produced in the same manner as example 1 and multilevel recording performed although the optically transparent substrate material was changed to polyolefin (Zeon Corp.; ZEONEX280).

The glass transition temperature of the polyolefin was 123° C.

The recording conditions were identical to example 1.

Jitter values of the recorded signals were measured in the same manner.

Comparative Example 1

An optical recording medium was produced in the same manner as example 1 and multilevel recording performed although the film thickness of the Ag film was changed to 40 nm.

Problems with the signal quality were found especially if the laser irradiate on time was long when measuring the jitter value of the recorded signals in the same manner

Comparative Example 2

An optical recording medium was produced in the same manner as example 5 and multi level recording performed although the film thickness of the Cu film was changed to 40 nm. The jitter value of the recorded signals was measured in the same manner.

Comparative Example 3

An optical recording medium was produced in the same manner as example 2 and multi level recording per formed although the reflecting film was changed to Al (coefficient of thermal conductivity of aluminum is 237 k/W·m$^{-1}$·K$^{-1}$; chronological table of science).

Jitter values of the recorded signals were measured in the same manner.

Comparative Example 4

An optical recording medium was produced and multi-level recording performed in the same manner although the substrate material was changed to glass. The pre-groove configuration on the glass was the same as example 1 and a plasma etching method was used as the method to form the grooves. The recording conditions were identical to example 1. Jitter values of the recorded signals were measured in the same manner.

The relationship between the jitter values, reflecting film characteristics and laser irradiation time in the above results are shown in Table 1.

TABLE 1

| | Example | | | | | | Comparative example | | | |
|---|---|---|---|---|---|---|---|---|---|---|
| Reflecting film | 1 Silver | 2 Silver | 3 Gold | 4 Gold | 5 Copper | 6 Silver | 1 Silver | 2 Copper | 3 Aluminum | 4 Silver |
| Film thickness (nm) | 50 | 100 | 50 | 100 | 50 | 50 | 40 | 40 | 100 | 40 |
| Film thickness × coefficient of thermal conductivity | 2.1 | 4.3 | 1.6 | 3.1 | 2.0 | 2.1 | 1.7 | 1.6 | 2.4 | 1.7 |

TABLE 1-continued

|  | Example | | | | | | Comparative example | | | |
|---|---|---|---|---|---|---|---|---|---|---|
| Reflecting film | 1 Silver | 2 Silver | 3 Gold | 4 Gold | 5 Copper | 6 Silver | 1 Silver | 2 Copper | 3 Aluminum | 4 Silver |
| Substrate | PC | PC | PC | PC | PC | PO | PC | PC | PC | Glass |
| Irradiation time | | | | | | | | | | |
| Jitter value % | | | | | | | | | | |
| (1) | 6.9 | 5.8 | 7.9 | 7.2 | 7.5 | 7.0 | 9.5 | 10.1 | 9.7 | 7.4 |
| (2) | 7.2 | 5.9 | 8.2 | 7.5 | 8.1 | 7.4 | 10.5 | 10.8 | 10.1 | 7.4 |
| (3) | 7.4 | 6.2 | 8.4 | 7.6 | 8.4 | 7.7 | 11.5 | 11.7 | 10.7 | 7.6 |
| (4) | 7.9 | 6.4 | 8.8 | 7.9 | 8.6 | 8.1 | 11.8 | 12.8 | 11.4 | 7.7 |
| (5) | 8.1 | 6.6 | 9.5 | 8.1 | 8.8 | 8.5 | 12.4 | 13.5 | 12.4 | 8.0 |
| (6) | 8.4 | 6.9 | 9.8 | 8.5 | 8.9 | 8.8 | 12.9 | 14.1 | 12.7 | 8.1 |

Example 7

An organic dye recording layer approximately 200 nm thick was formed under conditions identical to example 1 in which cyanine dye A used is as shown in the chemical formula below. A substrate on which a discrimination signal to indicate that the optical recording medium is being used for multilevel recording and information signals related to the laser beam irradiation time were recorded in advance was used for the optically transparent substrate used here.

[Chemical formula 1]

R: Alkyl group

Next, a sputtering method was utilized to form an Ag reflecting layer approximately 100 nm thick on the organic dye recording layer. A spin coat method in which the rpm was varied from 300 rpm up to 4000 rpm was used to coat a UV curable resin (Dainippon Ink Kagaku Kogyo Inc.: SD318) onto this reflecting layer. After the coating was completed, ultraviolet rays were irradiated by a mercury vapor lamp from above the coating film to form a 10 μm thick protective layer.

When multilevel recording was performed under conditions identical to example 1 using the optical recording medium obtained in this manner and the jitter values was measured, fluctuations due to differences in the laser beam irradiation time while recording were small and favorable results were obtained.

When thermal decomposition temperature measurements of this cyanine dye A were performed using a 2050 measurement device manufactured by TR Instrument Corp. at a temperature increase state of 10° C./minute within a nitrogen atmosphere, the decomposition start temperature was 230° C. and the temperature when the weight became 20% of the original weight (decomposition end temperature) was 480° C. Further, weight reductions in the cyanine dye due to thermal decomposition started at 300° C. or less and then continued until 350° C. or more.

Example 8

An optical recording medium was produced in the same manner as example 1 and multilevel recording performed although the dye in example 7 was changed to a 1:1 mixture (mol ratio) of cyanine A and phthalocyanine B dyes and the coating solvent was changed from fluoridated alcohol to ethyl cellosolve.

The laser beam power while recording was set to 13 mW. The linear recording velocity at this time was 4.8 m/s and the clock frequency for the recording was 4 MHz (250 nsec). The laser irradiation times while recording were (1) 50 nsec, (2) 70 nsec, (3) 90 nsec, (4) 110 nsec, (5) 130 nsec, and (6) 150 nsec.

Each signal was recorded over a period of one revolution of the disk. When the recording was performed in this manner and the jitter values of the recorded signals were read in and measured using a digital oscilloscope LC-534EL manufactured by Le Croy Corp., fluctuations due to differences in the laser beam irradiation time while recording were small and favorable results were obtained.

During thermal decomposition measurements of this dye mixture the decomposition start temperature was 230° C. and the decomposition end temperature was 480° C. Further, weight reductions in the dye mixture due to thermal decomposition started at 300° C. or less and then continued until 350° C. or more.

Example 9

An optical recording medium was produced in like manner to example 8 and multilevel recording performed although the dye in example 8 was changed to a 1:1 mixture (mol ratio) of cyanine A and phthalocyanine C dyes.

The laser beam power while recording was set to 13 mW. The linear recording velocity at this time was 4.8 m/s and the clock frequency for the recording was 4 MHz (250 nsec). The laser irradiation times while recording were (1) 50 nsec, (2) 70 nsec, (3) 90 nsec, (4) 110 nsec, (5) 130 nsec, and (6) 150 nsec. Each signal was recorded over a period of one revolution of the disk.

When the recording was performed in this manner and the litter values of the recorded signals were read in and measured using a digital oscilloscope LC-534EL manufactured by Le Croy Corp., fluctuations due to differences in the laser beam irradiation time while recording were small and favorable results were obtained.

During thermal decomposition measurements of this dye mixture the decomposition start temperature was 230° C.

and the decomposition end temperature was 547° C. Further, weight reductions in the dye mixture due to thermal decomposition started at 300° C. or less and then continued until 350° C. or more.

Comparative Example 5

An optical recording medium was produced in the same manner as example 7 and multilevel recording performed although the dye in example 7 was changed to phthalocyanine B dye as shown in the chemical formula below and the coating solvent was changed to ethyl cellosolve.

The laser beam power while recording was set to 14 mW. The linear recording velocity at this time was 4.8 m/s and the clock frequency for the recording was 4 MHz (250 nsec). The laser irradiation times while recording were (1) 70 nsec, (2) 80 nsec, (3) 90 nsec, (4) 100 nsec, (5) 110 nsec, and (6) 120 nsec. Each signal was recorded over a period of one revolution of the disk.

[Chemical formula 2]

M: Metal
R:

When the recording was performed in this manner and the jitter values of the recorded signals were read in and measured using a digital oscilloscope LC-534EL manufactured by Le Croy Corp., the jitter values were poor irregardless of the differences in the laser beam irradiation time while recording.

During thermal decomposition measurements of this phthalocyanine B dye the decomposition start temperature was 319° C. and the decomposition end temperature was 414° C.

Comparative Example 6

An optical recording medium was produced in the same manner as example 7 and multilevel recording performed although the dye was changed to phthalocyanine C dye as shown in the chemical formula below and the coating solvent was changed to methyl cyclohexane.

[Chemical formula 3]

M: Metal
R:

The laser beam power while recording was set to 14 mW. The linear recording velocity at this time was 4.8 m/s and the clock frequency for the recording was 4 MHz (250 nsec) The laser irradiation times while recording were (1) 70 nsec, (2) 80 nsec, (3) 90 nsec, (4) 100 nsec, (5) 110 nsec, and (6) 120 nsec. Each signal was recorded over a period of one revolution of the disk.

When the recording was performed in this manner and the jitter values of the recorded signals were read in and measured using a digital oscilloscope LC-534EL manufactured by Le Croy Corp., the jitter values were poor irregardless of the differences in the laser beam irradiation time while recording.

During thermal decomposition measurements of this phthalocyanine C dye the decomposition start temperature was 510° C. and the decomposition end temperature was 546° C.

Table 2 shows the results of the thermal decomposition characteristics of the dyes, laser irradiation times while recording and jitter values of recorded signals in examples7–9, comparative examples 5 and 6, and examples 10 and 11 described later.

TABLE 2

|  | Example | | | | | Comparative example | |
| --- | --- | --- | --- | --- | --- | --- | --- |
|  | 7 | 8 | 9 | 10 | 11 | 5 | 6 |
| Decomposition start temperature (° C.) | 230 | 230 | 230 | 263 | 242 | 319 | 510 |
| Decomposition end temperature (° C.) | 480 | 480 | 547 | 820 | 860 | 414 | 547 |
| Jitter value (%) | | | | | | | |
| Laser irradiation time (1) | 6.4 | 6.9 | 7.4 | 7.2 | 6.7 | 9.7 | 10.5 |
| Laser irradiation time (2) | 6.5 | 7.1 | 7.6 | 7.3 | 6.9 | 9.9 | 11.0 |
| Laser irradiation time (3) | 6.8 | 7.4 | 8.0 | 7.5 | 7.3 | 10.2 | 11.4 |

TABLE 2-continued

|  | Example | | | | | Comparative example | |
|---|---|---|---|---|---|---|---|
|  | 7 | 8 | 9 | 10 | 11 | 5 | 6 |
| Laser irradiation time (4) | 7.1 | 7.8 | 8.5 | 7.8 | 7.5 | 10.7 | 11.4 |
| Laser irradiation time (5) | 7.2 | 8.3 | 8.7 | 8.1 | 7.9 | 10.9 | 11.6 |
| Laser irradiation time (6) | 7.5 | 8.4 | 9.0 | 8.5 | 8.0 | 11.4 | 12.3 |

Example 10

In contrast to the conditions in example 1, the dye was changed to phthalocyanine dye produced by Ciba [Super Green] and the coating solvent was changed to dimethyl cyclohexane to produce the optical recording medium by forming the organic dye recording layer, approximately 100 nm thick at the pre-groove location, on the optically transparent substrate having the pre-groove with a depth of approximately 100 nm and a width of approximately 600 nm.

As shown in Table 2, when multilevel recording was performed under conditions identical to example 1 using the optical recording medium obtained in this manner and the jitter values was measured, fluctuations in the jitter values due to differences in the laser beam irradiation time while recording were small and favorable results were obtained.

During thermal decomposition measurements of this dye the decomposition start temperature was approximately 263° C. and the decomposition end temperature was approximately 820° C. In addition, weight reductions in the dye due to thermal decomposition started at 300° C. or less and then continued until 350° C. or more.

Example 11

In contrast to the conditions in example 1, the dye was changed to phthalocyanine dye produced by Yamada Chemicals [YDN-02] and the coating solvent was changed to a mixture of dimethyl cyclohexane, 2-methoxyethanol, methyl ethyl ketone and tetrahydorfuran and the concentration thereof was adjusted to 1.5 wt % to produce the optical recording medium by forming the organic dye recording layer, approximately 120 nm thick at the pre-groove location, on the optically transparent substrate having the pre-groove with a depth of approximately 160 nm and a width of approximately 650 nm.

As shown in Table 2, when multilevel recording was performed under conditions identical to example 1 using the optical recording medium obtained in this manner and the jitter values was measured, fluctuations in the jitter values due to differences in the laser beam irradiation time while recording were small and favorable results were obtained.

During thermal decomposition measurements of this dye the decomposition start temperature was approximately 242° C. and the decomposition end temperature was approximately 860° C. In addition, weight reductions in the dye due to thermal decomposition started at 300° C. or less and then continued until 350° C. or more.

What is claimed is:

1. A method for multilevel recording onto an optical recording medium using a laser, the optical recording medium of the type comprising:
   an optically transparent substrate, said substrate made of a thermoplastic resin with a glass transition point (Tg) between 80° C. and 160° C.;
   a recording layer provided on said optically transparent substrate, said recording layer having a dye as a principle component, said recording layer having a virtual recording cell;
   a reflecting film, provided on the recording layer, said reflecting film comprising a metal having a coefficient of thermal conductivity of 300 k/W·m$^{-1}$·K$^{-1}$ or more and a film thickness at a recording mark of 50 nm or more;
   wherein information can be recorded on the recording medium by forming recording marks on the recording layer by irradiating the laser and the recorded information can be read by irradiating a read laser onto the recording mark, and
   wherein the virtual recording cell is specified in an arbitrary unit length in a direction of relative movement between the laser and the recording layer and in a unit width in a direction that intersects said direction of movement;
   the method for multilevel recording comprising the step of:
      forming recording marks in said virtual recording cell at any of at least five levels, said recording marks varying in size depending on one of modulation of irradiation time of the laser and modulation of irradiation power of the laser, resulting in multilevel recording of information.

2. The method for multilevel recording onto an optical recording medium using a laser according to claim 1, further comprising the step of determining the product of the reflecting film coefficient of thermal conductivity and the reflecting film thickness, wherein the film thickness is 2×10$^{-5}$ k/W·K$^{-1}$ or more.

3. A method for multilevel recording onto an optical recording medium using a laser, the optical recording medium of the type comprising:
   an optically transparent substrate;
   a recording layer provided on said optically transparent substrate, said recording layer having a dye as a principle component and said recording layer having a virtual recording cell;
   wherein said dye used in said recording layer is made in such a manner that differences in a weight reduction start temperature due to thermal decomposition (TG) and a temperature when a weight thereof becomes 20% of an original weight thereof extends over a range of 100° C. or more;
   wherein information can be recorded on the recording medium by forming recording marks on the recording layer by irradiating the laser and the recorded information can be read by irradiating a read laser onto the recording mark, and
   wherein the virtual recording cell is specified in an arbitrary unit length in a direction of relative movement between the laser beam and the recording layer and in a unit width in a direction that intersects said direction of movement at a right angle and continuously set in said direction of movement;
   the method for multilevel recording comprising the step of:
      forming recording marks of various sizes in said virtual recording cell at any of at least five levels, said recording marks varying in size depending on one of modulation of irradiation time of the laser and modulation of irradiation power of the laser, resulting in multilevel recording of the at least five levels of information.

4. The method for multilevel recording onto an optical recording medium using a laser according to claim 3, further comprising the step of determining weight reduction of said dye due to said thermal decomposition starting at 300° C. or less and continuing until 350° C. or more.

5. The method for multilevel recording onto an optical recording medium using a laser according to claim 3, further comprising the step of providing a reflecting film on said recording layer on a side opposite to a side on which the laser beam is incidental, and wherein said optically transparent substrate is a thermoplastic resin with a glass transition point (Tg) of between 80° C. and 160° C., and said reflecting film is a metal with a coefficient of a formal conductivity of 300 k/W·m$^{-1}$·K$^{-1}$ or more and a film thickness on a recording mark of 50 nm or more.

6. The method for multilevel recording onto an optical recording medium using a laser according to claim 5, further comprising the step of determining the product of the reflecting film coefficient of thermal conductivity and the reflecting film thickness, wherein the film thickness is $2 \times 10^5$ k/W·K$^{-1}$ or more.

7. The method for multilevel recording onto an optical recording medium using a laser according to claim 4, further comprising the step of providing a reflecting film on said recording layer on a side opposite to a side on which the laser beam is incidental, and wherein said optically transparent substrate is a thermoplastic resin with a glass transition point (Tg) of between 80° C. and 160° C., and said reflecting film is a metal with a coefficient of a formal conductivity of 300 k/W·m$^{-1}$·K$^{-1}$ or more and a film thickness on a recording mark of 50 nm or more.

8. The method for multilevel recording onto an optical recording medium using a laser according to claim 7, further comprising the step of determining the product of the reflecting film coefficient of thermal conductivity and the reflecting film thickness, wherein the film thickness is $2 \times 10^5$ k/W·K$^{-1}$ or more.

* * * * *